United States Patent [19]

Horng et al.

[11] 4,309,812

[45] Jan. 12, 1982

[54] PROCESS FOR FABRICATING IMPROVED BIPOLAR TRANSISTOR UTILIZING SELECTIVE ETCHING

[75] Inventors: Cheng T. Horng; Robert O. Schwenker, both of San Jose, Calif.; Paul J. Tsang, Poughkeepsie, N.Y.

[73] Assignee: International Business Machines Corporation, Armonk, N.Y.

[21] Appl. No.: 126,610

[22] Filed: Mar. 3, 1980

[51] Int. Cl.[3] .................. H01L 21/265; H01L 21/285; H01L 21/31

[52] U.S. Cl. ...................................... 29/578; 29/579; 29/587; 29/590; 29/591; 148/1.5; 148/187; 156/643; 156/644; 156/653; 204/192 EC

[58] Field of Search .................. 29/578, 579, 587, 590, 29/591; 148/1.5, 187, 174; 156/643, 644, 650, 653, 657, 659.1; 357/49, 50, 54, 65, 91; 204/15, 325, 192 E, 192 EC

[56] References Cited

U.S. PATENT DOCUMENTS

| | | | |
|---|---|---|---|
| 3,940,288 | 2/1976 | Takagi et al. | 148/1.5 |
| 3,986,897 | 10/1976 | McMillan | 148/6.27 |
| 4,060,427 | 11/1977 | Barile et al. | 29/579 X |
| 4,063,992 | 12/1977 | Hosack | 156/653 |
| 4,068,018 | 1/1978 | Hashimoto et al. | 427/38 |
| 4,089,709 | 5/1978 | Harris | 148/6.27 |
| 4,104,086 | 8/1978 | Bondur et al. | 148/1.5 |
| 4,110,125 | 8/1978 | Beyer | 156/643 X |
| 4,139,442 | 2/1979 | Bondur et al. | 204/192 E |
| 4,157,269 | 6/1979 | Ning et al. | 148/1.5 |
| 4,159,915 | 7/1979 | Anantha et al. | 148/1.5 |
| 4,160,991 | 7/1979 | Anantha et al. | 359/49 |
| 4,174,562 | 11/1979 | Sanders et al. | 29/578 |
| 4,242,791 | 1/1981 | Horng et al. | 29/578 |
| 4,252,582 | 2/1981 | Anantha et al. | 148/187 X |

*Primary Examiner*—L. Dewayne Rutledge
*Assistant Examiner*—W. G. Saba
*Attorney, Agent, or Firm*—Wesley DeBruin

[57] ABSTRACT

Disclosed is a self-aligned process for providing an improved bipolar transistor structure.

The process includes the chemically etching of an intermediate insulating layer to undercut another top layer of a different insulating material in a self-aligned emitter process wherein the spacing of the emitter contact to the polysilicon base contact is reduced to a magnitude of approximately 0.2 to 0.3 micrometers. In addition, in the process an emitter plug is formed to block the emitter region from the heavy P+ ion dose implant of the extrinsic base.

11 Claims, 23 Drawing Figures

PROCESS FOR FABRICATING IMPROVED BIPOLAR TRANSISTOR UTILIZING SELECTIVE ETCHING

FIELD OF THE INVENTION

The invention relates to a method for fabricating high performance bipolar integrated circuits and the resulting integrated circuit device has a junction spacer to provide a very small spacing between the emitter and external base region.

CROSS REFERENCE TO RELATED U.S. PATENT APPLICATIONS

U.S. patent application, Ser. No. 077,699 entitled "High Performance Bipolar Transistors Fabricated by Post Emitter Base Implantation Process", filed Sept. 21, 1979 by C. T. Horng et al., and of common assignee herewith, granted as U.S. Pat. No. 4,242,791 on Jan. 6, 1981.

U.S. patent application Ser. No. 098,588 entitled "A Self-Aligned Micrometer Bipolar Transistor Device and Process" filed Nov. 29, 1979 by C. T. Horng et al., and of common assignee herewith.

BACKGROUND OF THE INVENTION AND PRIOR ART

Numerous integrated circuit devices, structures and techniques of fabricating same are known to the prior art. The following prior art patents and summaries are submitted to generally represent the state of the art.

Reference is made to U.S. Pat. No. 3,986,897 entitled "Aluminum Treatment to Prevent Hillocking" granted Oct. 19, 1976 to L. D. McMillan et al. The McMillan et al patent discloses a method of surface treating aluminum, particularly aluminum metallization for semiconductors, which includes subjecting the aluminum surface to be treated with fuming nitric acid for one to ten minutes at room temperature. Follow cleaning, the surface is subjected to boiling water for five to fifteen minutes. The foregoing treatment appears to form a boehmite [alO—(OH)] layer on the surface of the aluminum, thereby substantially eliminating hillocking.

Reference is made to U.S. Pat. No. 4,068,018 entitled "Process For Preparing A Mask For Use In Manufacturing A Semiconductor Device" granted Jan. 10, 1978 to T. Hashimoto et al. The Hashimoto et al patent discloses a process for preparing a mask, such as a photomask, used in a selective etching process in the manufacture of a semiconductor device or a mask for use in a process for selectively providing a porous layer of silicon or for anodic oxidation of a metal layer, in which ions accelerated at a predetermined voltage are implanted into a photoresist film to a predetermined dose level.

Reference is made to U.S. Pat. No. 4,089,709 entitled "Method for Passivating Aluminum Layers on Semiconductor Devices" granted May 16, 1978 to J. M. Harris. The Harris patent discloses an aluminum layer such as an intraconnect circuit semiconductor device passivated by oxidizing the aluminum layers to form a thin layer of amorphous alumina thereon. The alumina layer is coated with a surface active agent to form a hydrophobic surface on the aluminum oxide to inhibit the creation and growth of ALOOH on the oxide layer. The hydropholic surface is coated with a conventional passivating material such as silicon dioxide, epoxy or the like.

Reference is made to U.S. Pat. No. 4,157,269 entitled "Utilizing Polysilicon Diffusion Sources and Special Masking Techniques" granted June 5, 1979 to T. H. Ning et al. The Ning et al. patent discloses a method consisting of a sequence of process steps for fabricating a bipolar transistor having base contacts formed of polysilicon material and an emitter contact formed of polysilicon material or metal. The emitter contact is self-aligned to the base contacts by the use of process steps wherein a single mask aperture is used for defining the base contacts and the emitter.

Reference is made to U.S. Pat. No. 4,159,915 entitled "Method For Fabricating Vertical NPN and PNP Structures Utilizing Ion-Implantation" granted July 3, 1979 to N. G. Anantha et al. The Anantha et al patent discloses a method for fabricating vertical NPN and PNP structures on the same semiconductor body. The method involves providing a monocrystalline semiconductor substrate having regions of monocrystalline silicon insolated from one another by isolation regions. Buried regions are formed by overlapping the juncture of the substrate and epitaxial layer and are located in at least one of the regions of isolated monocrystalline silicon. The P base region in the NPN designated regions and a P reach through in the PNP designated regions are formed simultaneously. The emitter region in the NPN regions and base contact region in the PNP regions are then formed simultaneously. The P emitter region in the PNP region is then implanted by suitable ion implantation techniques. A Schottky barrier collector contact in the PNP regions are formed. Electrical contacts are then made to the PNP and NPN transistor elements. A PNP device may be fabricated without the formation of an NPN device if it is so desired.

Reference is made to U.S. Pat. No. 4,160,991 entitled "High Performance Bipolar Device and Method for Making Same" granted July 10, 1979 to N. G. Anantha et al. The Anantha et al patent discloses a method for manufacturing a high performance bipolar device. The resulting structure has a very small emitter-base spacing. The small emitter-base spacing, reduces the base resistance compared to earlier device spacing and thereby improves the performance of the bipolar device. The method involves providing a silicon semiconductor body having regions of monocrystalline silicon isolated from one another by isolation regions and a buried subcollector therein. A base region is formed in the isolated monocrystalline silicon. A mask is formed on the surface of the silicon body covering those regions designated to be the emitter and collector reach-through regions. A doped polycrystalline silicon layer is then formed through the mask covering the base region and making ohmic contact thereto. An insulating layer is formed over the polysilicon layer. The mask is removed from those regions designated to be the emitter and collector reach-through regions. The emitter junction is then formed in the base region and the collector reach-through formed to contact the buried subcollector. Electrical contacts are made to the emitter and collector. The doped polycrystalline silicon layer is the electrical contact to the base regions.

The present trend in semiconductor technology is toward large scale integration of devices with very high speed and low power performance. The parameters that are essential to such high performance bipolar transistors are low parasitic capacitances as realized by (a)

shallow vertical junction and (b) small horizontal geometry. To achieve these goals it is necessary to make the devices in the integrated circuits as small as possible.

With the advance in semiconductor processing technologies, such as in the fields of ion implantation, deep dielectric isolation, electron beam and x-ray lithography, reactive ion etching (RIE), advanced insulator and polysilicon deposition techniques, and metal lift-off processes, fabrication of the ultrahigh performance integrated circuit devices can be achieved.

Ion-implantation provides a means for precisely controlling the total amount of impurity transferred to the wafer. The impurity depth distribution is accurately controlled by implant energy. Unlike the conventional thermal diffusion process ion implantation is not a high temperature process. Thus, by using photoresist or metal masking, multiple impurity introduction operations can be achieved without resort to high temperatures. A final thermal drive-in diffusion is sufficient to anneal out the radiation damage caused by implantation, and obtain desired device junction depth. Consequently, integrated circuit devices can be made shallower, with greater precision of the impurity distribution using ion implantation technology.

As the semiconductor devices become shallower, it is desirable to reduce the overall junction area so as to reduce parasitic capacitance. Further reduction of device parasitic capacitance can be achieved by shrinking of device horizontal dimensions and using dielectric isolation. Dielectric isolation is a method of fabricating integrated circuits in which the device components are isolated by other than P-N junctions. A well known dielectric isolation namely, "Recessed Oxide Isolation" (ROI) is a commonly used process in present day semiconductor technology. Using $Si_3N_4$ as the oxidation barrier, the ROI technique is done by etching grooves into the semiconductor wafer adjacent those regions in which PN junctions are to be formed. The silicon exposed by the grooves is then thermally oxidized to form recessed oxide regions providing dielectric isolation. The problem associated with the ROI is the formation of "bird's head" and "bird's beak" structure at the lateral edges of recessed oxide. The "bird's head" is undesirable because it can cause breaks or discontinuities in thin films covering the steps. The indefiniteness of "bird's beak" structure reduces the available active surface area and, therefore, imposes the need for wider tolerance of lateral dimension in the integrated circuit layout. A newly developed oxide isolation called "Deep Dielectric Isolation" (DDI) avoids the above mentioned ROI problem. The DDI process utilizes reactive-ion etching (RIE) to form deep narrow trenches into the wafer surrounding those regions in which devices are to be formed. [Reference is made to U.S. Pat. No. 4,104,086, entitled "Method for Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method for Producing Deep Dielectric Isolation in Silicon" granted Feb. 13, 1979 to J. A. Bondur et al., respectively of common assignee with subject application]. The trenches are overfilled with $SiO_2$ put down by chemical vapor deposition (CVD) technique. The overfilled $SiO_2$ also planarizes the device surface. A blanket RIE back-etching to the semiconductor surface yield deep oxide isolation trenches. Unlike the bird's beak in ROI structure, sidewalls of the DDI structure are nearly vertical. The surface of DDI regions and the silicon where devices are to be formed are coplanar. With DDI, the doping process for various device regions is then self-aligned by oxide isolation. The self-aligned process eliminates precise mask alignment steps and also saves a number of mask steps in the device fabrication.

As mentioned above, DDI enables us to form devices with considerably smaller cell size than those formed by using either P-N isolation or by ROI. Further reduction of device horizontal dimension requires the use of high resolution capabilities of lithography and etching processes. The electron lithography is the most promising method for delineating submicron size device patterns. For device window opening, the reactive ion etching (RIE) is the most attractive alternative of the conventional wet solution etching. The RIE is a dry process having directional etching characteristics. The etched device windows preserve the lithography defined etch mask dimensions, and the openings have vertical sidewalls. Thus, the E-beam lithography and reactive ion etching are common for fabricating very small device geometries.

For the very small bipolar transistor devices, as for example, micron size transistors, the base areas and, therefore, the collector-base parasitic capacitance is the most significant performance parameter. In the bipolar transistor the active base area is the region below the emitter. In the conventional transistors, fabricated by prior art, the base contacts are formed above the inactive base area surrounding the emitter. The transistor base area that is needed to accommodate the emitter and base contacts is considerably larger than the active base area. To reduce the base area for making ultra high performance bipolar transistors, a different approach in making the base contact is desirable.

SUMMARY OF THE INVENTION

It is a primary object of the invention to provide a process for fabricating improved high performance integrated circuit devices.

It is a further object to provide an improved bipolar transistor structure and a method of fabricating same.

The process includes the chemical etching of an intermediate insulating layer to undercut another top layer of a different insulating material in a self-aligned emitter process wherein the spacing of the emitter contact to the polysilicon base contact is reduced to a magnitude of approximately 0.2 to 0.3 micrometer. Further, in the process an emitter plug is formed to block the emitter region from the heavy boron ion dose implant of the extrinsic base, and self-aligned intrinsically formed emitter contact opening is achieved.

In accordance with the invention, a process is disclosed for forming an improved bipolar transistor in a monocrystalline silicon substrate of a first conductivity type, said silicon substrate having a planar surface, a subcollector region of a second conductivity type formed in said substrate, an epitaxial layer of said second conductivity type formed on said planar surface of said substrate, and at least first and second spaced apart recessed oxide isolation regions extending through said epitaxial layer into said substrate, said process including the following steps: form a first oxide layer on said epitaxial layer; form a silicon nitride layer on said first oxide layer; form a second oxide layer on said silicon nitride layer; utilizing E-beam photolithography to form a small emitter window in a photoresist mask overlying said second oxide layer, said window being between said first and second oxide layer exposed by said window and also an adjacent surrounding portion of said second oxide layer beneath said photoresist; utilizing said photoresist window reactive ion etch said silicon nitride layer and said first silicon oxide layer exposed through said window; ion implant an emitter region with dopant of a second conductivity type; remove said photoresist; remove the exposed portion of silicon nitride layer, formerly underlying said removed photoresist layer and corresponding to said removed adjacent surrounding portion of said second layer; form an emitter plug to mask said emitter region, said emitter plug being defined by said opening in said silicon nitride layer; utilizing photolithographic techniques form and develop a resist pattern having an extrinisic base window fully encompassing said emitter plug and extending from said first spaced apart recessed oxide isolation region to said second spaced apart recessed oxide isolation region; utilize reactive ion etching to expose the epitaxial layer in the to be formed extrinsic base region; ion implant an extrinsic base region with dopant of a first conductivity type; deposit a layer of polysilicon the exposed surface; deposit a silicon dioxide layer on said polysilicon layer; ion implant said layer of polysilicon with dopant of a first conductivity type: remove the resist layer and emitter plug; ion implant the intrinsic base region with dopant of a first conductivity type; deposit a layer of silicon nitride on the exposed surface; convert the silicon nitride covering the emitter region to silicon dioxide; utilizing an etchant dip open the emitter contact opening; and utilizing known techniques provide contact openings to the external base connection and the collector reach-through.

BRIEF DESCRIPTION OF THE DRAWINGS

FIG. 23 is a cross-sectional view of an improved bipolar transistor structure in accordance with the invention.

PREFERRED EMBODIMENT OF THE INVENTION

Figure 1:
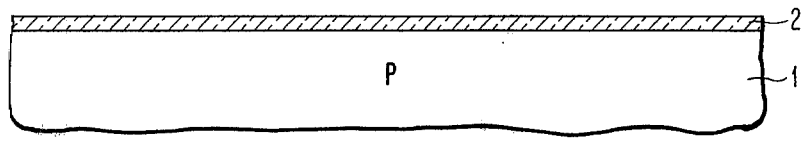
FIGS. 1 through 23 are cross-sectional views disclosing the structure at successive stages, or steps in accordance with the invention.

Starting with P-type, (100), 10-20 ohm centimeter silicon substrate; wafers are first thermally oxidized by conventional steam oxidation method to form $SiO_2$ layer 2. The silicon dioxide layer 2, as shown in FIG. 1 has a thickness of approximately 200-500 nanometer.

Figure 2:
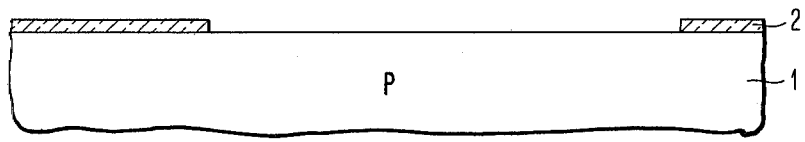

As seen from FIG. 2, a subcollector diffusion window is then opened through the silicon dioxide layer 2 by employing known photolithography techniques.

Figure 3:
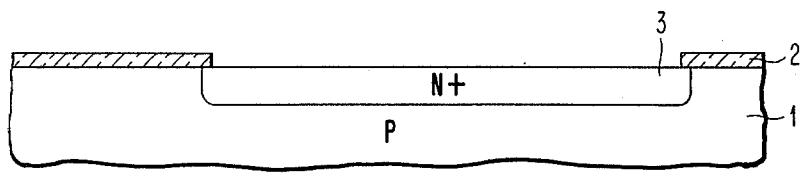

As shown in FIG. 3, a subcollector 3 is then formed by conventional diffusion or ion implantation of an N+ impurity such as arsenic or phosphorus. Arsenic is preferred.

Figure 4:
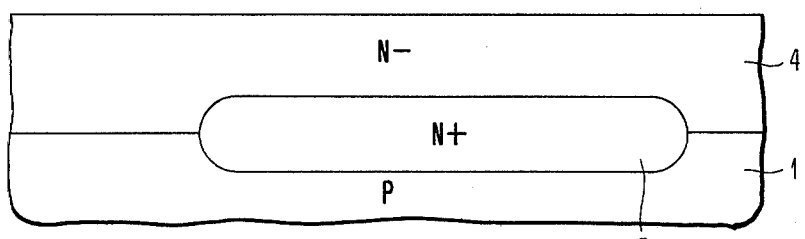

Referring to FIG. 4, after the subcollector is formed, the silicon dioxide layer 2 is stripped, the substrate is cleaned, and an N− epitaxial layer 4 is grown. The epitaxial layer is preferably 1 to 3 micrometer in thickness.

Figure 5:
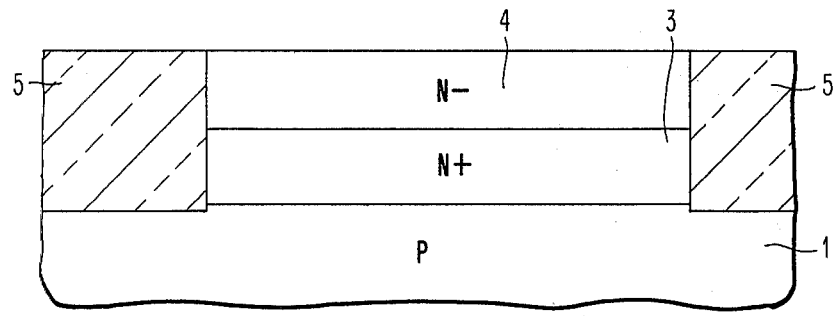
Figure 6:
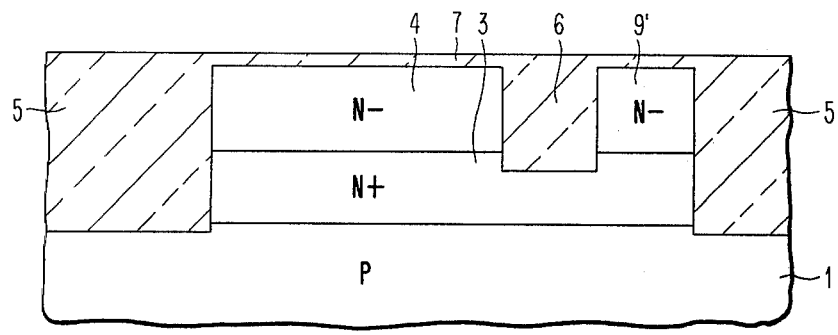

Next, the device isolations are provided. This is achieved by first forming the interdevice dielectric isolation 5, as shown in FIG. 5, and then the shallower base-collector isolation 6, as shown in FIG. 6. These device dielectric isolations are accomplished by either recessed oxide isolation (ROI) or by deep trench dielectric isolation (DDI). The terms and processes of recessed oxide isolation (ROI) and deep trench dielectric isolation are discussed and explained herein supra.

Referring to FIG. 6, after all the isolations are formed, a thin layer 7 of silicon dioxide $SiO_2$ is then grown. The $SiO_2$ layer 7 has a thickness of about 150 nanometer.

Figure 7:
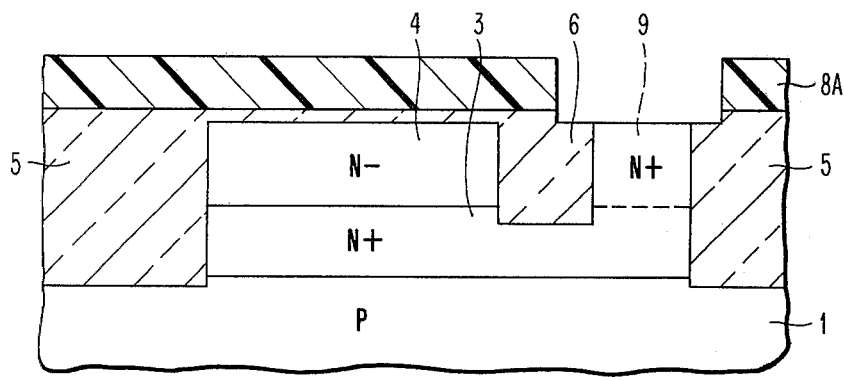

Then, an ion-implant-blocking-mask 8A is formed by a conventional photolithographic process. The thin oxide that is over the collector reach through region 9 is removed by BHF etching, and collector reach through 9 is then formed by phosphorous ion implantation. This is shown in FIG. 7.

After the collector reach through is formed, the blocking resist mask is stripped, the thin oxide 7 is removed and the surface of the wafer is cleaned. Then, referring to FIG. 8, a thin oxide layer 8 of 150 nanometer thickness is regrown and a silicon nitride, $S_3N_4$, layer 9A, having a thickness in the order of 50 nanometer, is chemically vapor deposited (CVD) on the silicon dioxide layer 8. Subsequent thereto, a silicon dioxide $SiO_2$ layer 10 is chemically vapor deposited (CVD) on the silicon nitride layer 9A. The silicon dioxide layer 10 preferably has a thickness in the order of 100 nanometer.

Figure 9:
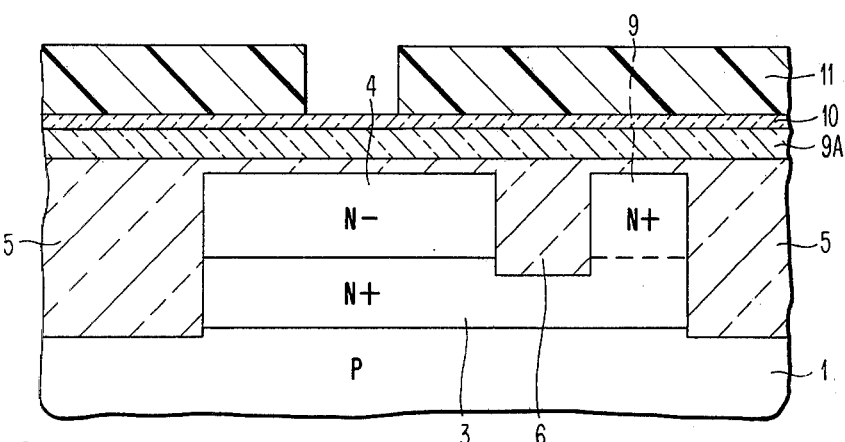

As shown in FIG. 9, employing photoresist and E-beam lithography, a resist pattern 11 having an emitter window is formed on the surface of the substrate. The resist is plasma hardened and high temperature (170°–200° C.) post baked to increase etching resistance.

Figure 10:
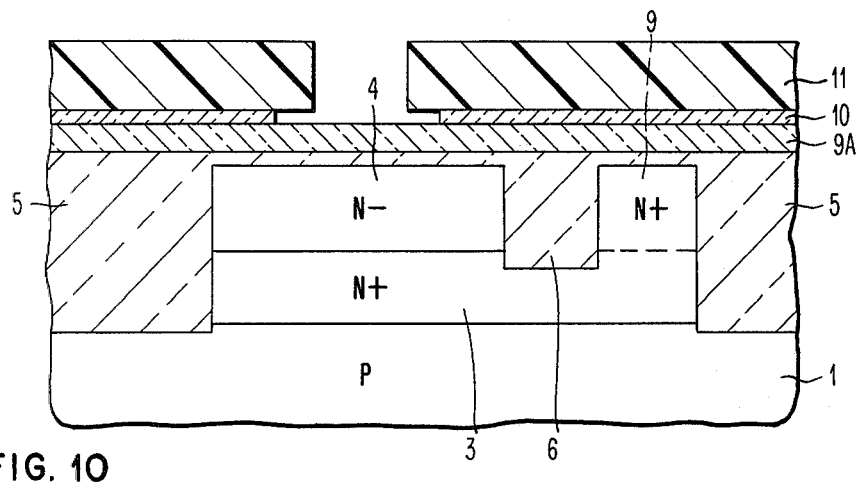

Referring to FIG. 10, utilizing the emitter window in the resist pattern 11, the exposed portion of the CVD $SiO_2$ layer 10 is etched. The etching may be accomplished by employing a buffered Hydro-fluoric (BHF) solution. As depicted in FIG. 10, a controlled over etch is carried out to undercut the CVD $SiO_2$ layer. The $SiO_2$ layer 10, as shown in FIG. 10, is undercut approximately 0.2 to 0.3 micrometer.

Figure 11:
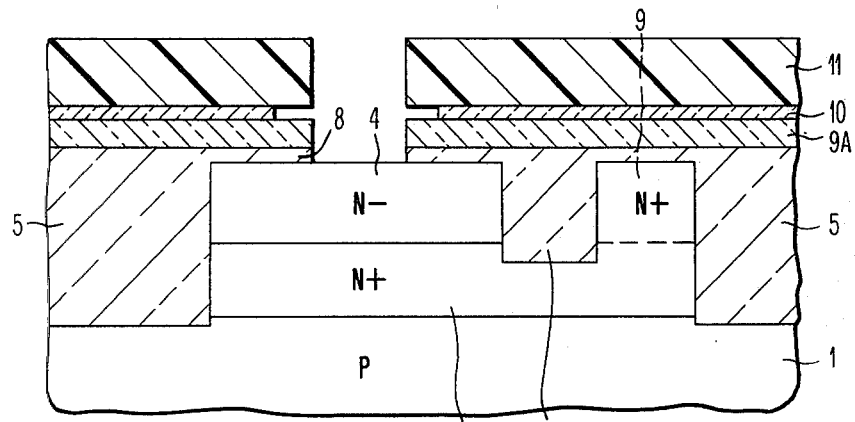

Referring to FIG. 11, utilizing a reactive ion etch (RIE) technique, the portion of the $Si_3N_4$ layer 9A and the underlying portion of $SiO_2$ layer 8 exposed by the emitter window in resist layer 11 is removed. By virtue of the directionality of RIE, openings in the $Si_3N_4$ layer 9A and in the $SiO_2$ layer 8 are direct replicas (correspond identically) to the emitter window opening in resist layer 11. Thereafter, the resist layer 11 is stripped.

Figure 12:
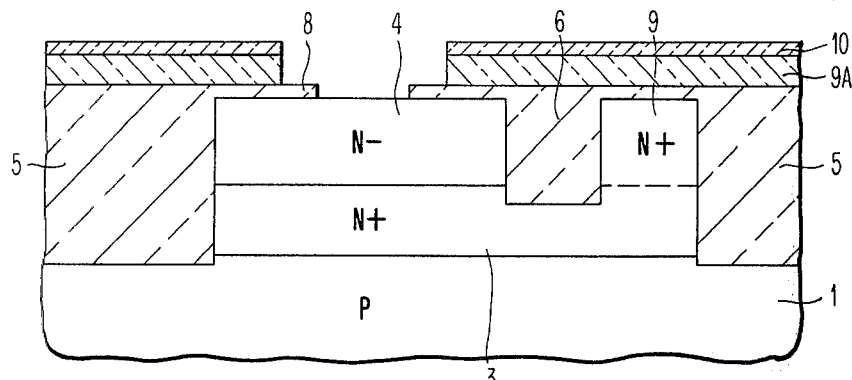

Referring to FIG. 12, the portion of $Si_3N_4$ layer 9A exposed in the emitter opening is etched. The etchant is preferably a solution of 10% $H_2So_4$ and 90% $H_3PO_4$. Thus, the enlarged emitter window is provided in $Si_3N_4$ layer 9A as well as $SiO_2$ layer 10. [Attention is directed to the fact that the opening in $SiO_2$ layer 8 is smaller than the opening in layers 9A and 10].

Figure 13:
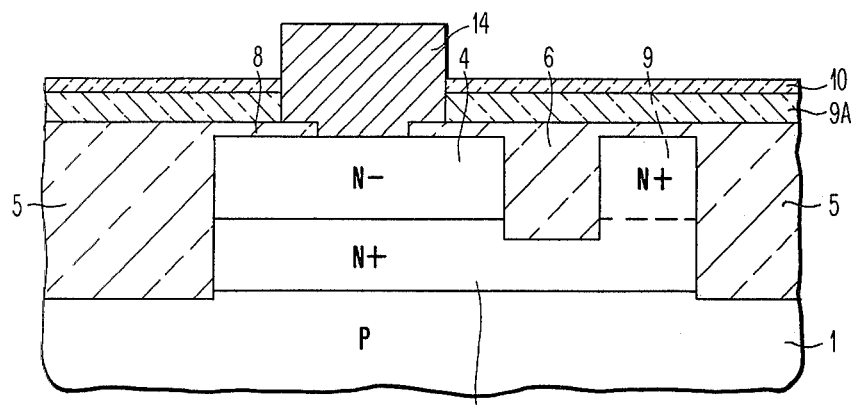

As shown in FIG. 13, an emitter plug 14 made of $Al_2O_3$ or MgO is formed in the emitter window opening. The emitter plug is formed by one of two processes set forth hereinafter. For convenience of explanation, these two processes are respectively designated Procedure A and Procedure B.

Procedure A

Figure 14:
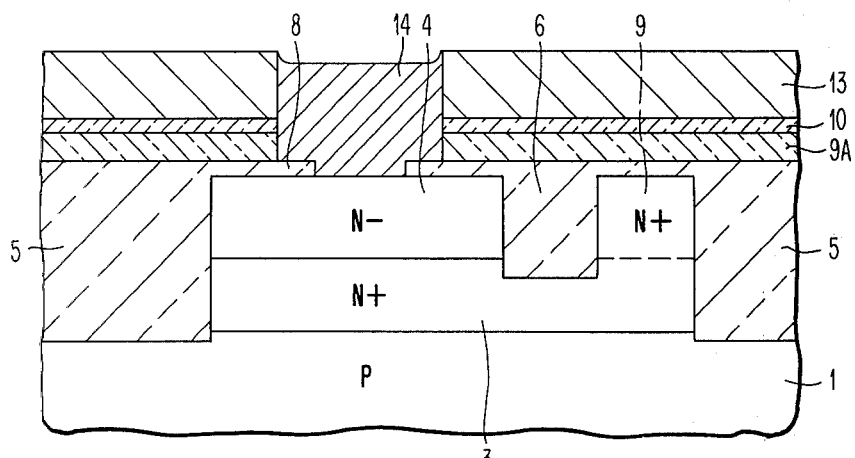

Referring to FIG. 14, a layer of relatively thick (1.0 to 2.0 micrometer) aluminum (Al) is deposited on the exposed surface of the structure. The Al layer is anodized in an aqua solution containing 5% $H_2So_4$. The aluminum in the emitter region, i.e., the emitter plug 14, is converted to $Al_2O_3$ because of the existence of a direct current path therethrough. After the $Al_2O_3$ is formed and properly densified and sealed, the unreacted Al is then stripped off leaving the Al$_2$O$_3$ emitter plug 14 in place. (See FIG. 13).

Procedure B

Alternatively, the emitter plug may be formed by a refill and lift-off process. In this process, the aluminum disposition and anodization are done exactly the same way as in Procedure A.

Figure 15:
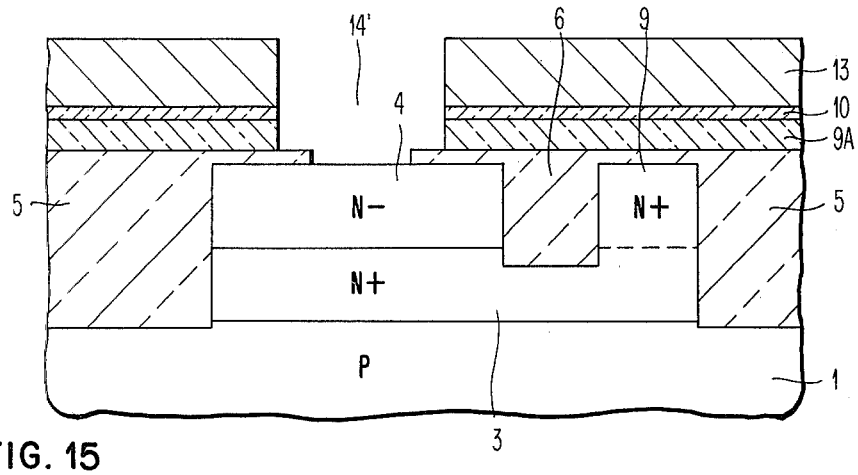
Figure 16:
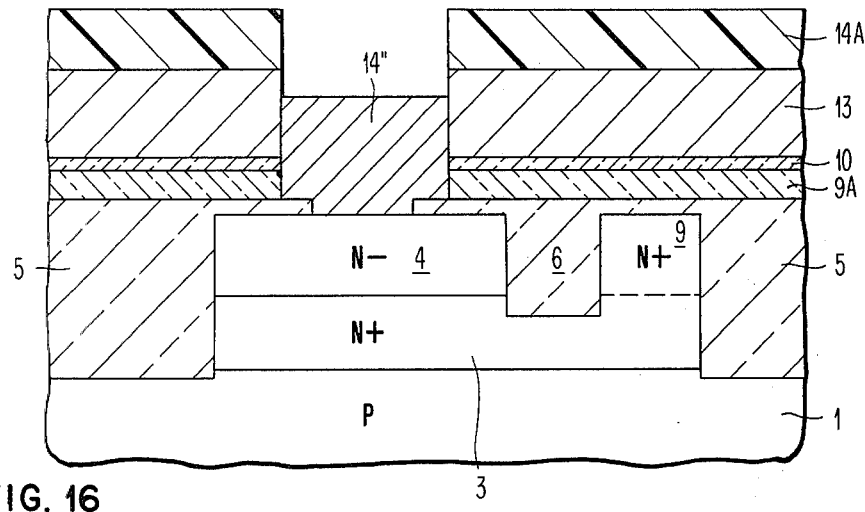

However, after Al anodization, the porous Al$_2$O$_3$ that is formed on top of the emitter region is etched away, leaving an emitter plug well 14' as shown in FIG. 15. The well is then refilled with vacuum evaporated Al$_2$O$_3$, MgO, or photoresist (reference character 14A, FIG. 16) to half of its depth as shown in FIG. 16 reference character 14".

Due to the directionality of vacuum deposition, sidewalls of the emitter plug well are not covered completely with the material deposited (Al$_2$O$_3$, MgO, or photoresist) during vacuum deposition. The unreacted Al can then be lifted off by chemically etching with the etching being initiated at the exposed aluminum sidewalls. Thus, the Al$_2$O$_3$ (or MgO) emitter plugs are formed in the emitter region as shown in FIG. 13.

Figure 17:
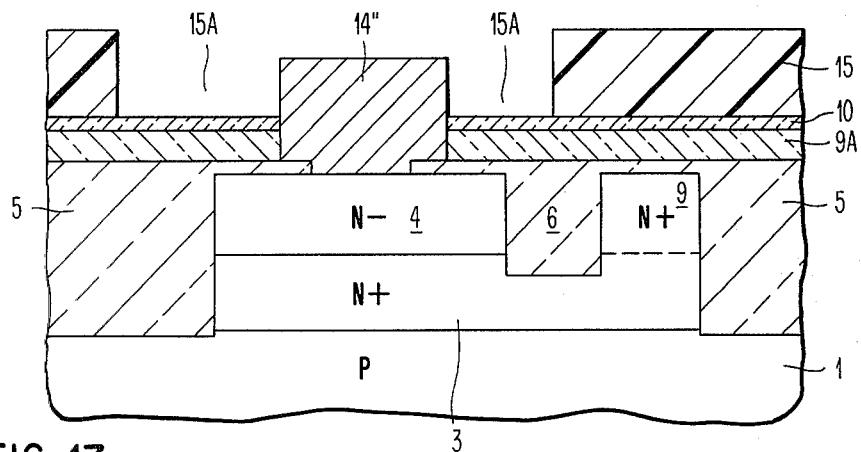

After the emitter plug is formed, the extrinsic base of the transistor is to be formed. The extrinsic base consists of an extrinsic base diffusion (region 17 of FIG. 18) and an extrinsic base polysilicon extension (region 18 of FIG. 19). The extrinsic base diffusion is first to form by a process sequence shown in FIG. 17 and FIG. 18. As shown in FIG. 17, photolithographic techniques are utilized to form a resist pattern 15 which has windows 15A, encompassing the emitter plug 14 and the spacing between the deep oxide isolation trench 5 and the shallow oxide isolation trench 6.

Figure 18:
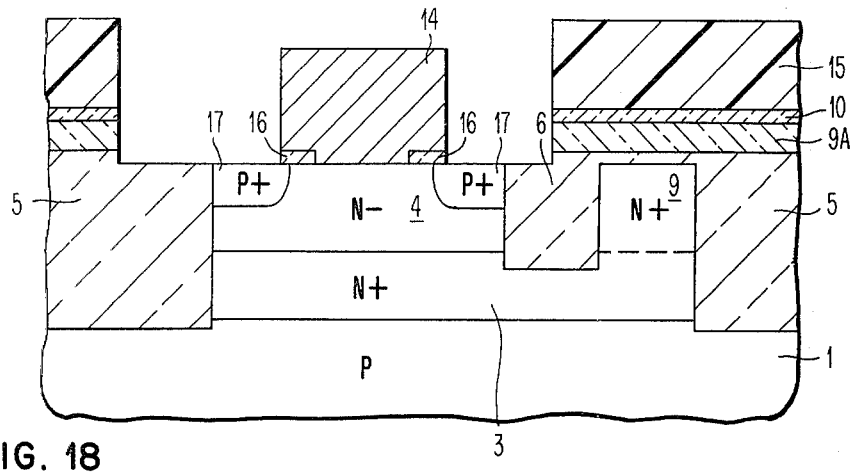
Figure 19:
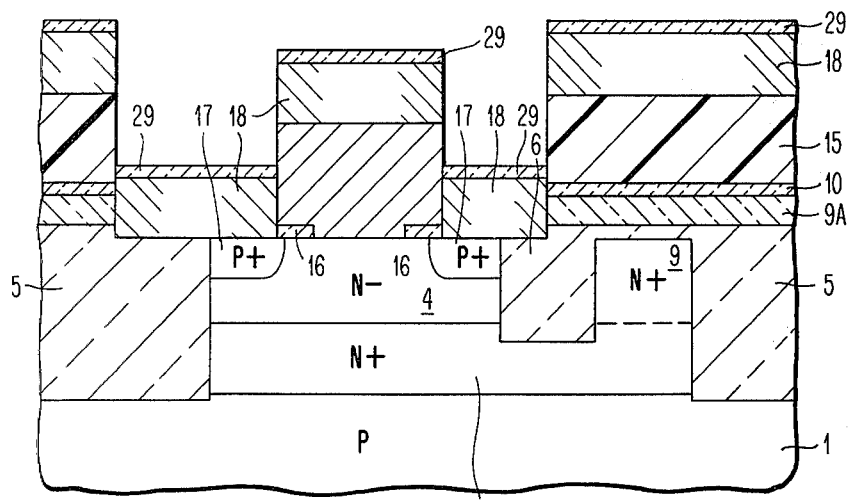

Then, referring to FIG. 18, a reactive ion etch (RIE) technique is utilized to remove the portion of Si$_3$N$_4$ layer 10 and the underlying portion of SiO$_2$ layer 9A exposed by window 15A in resist layer 15. The RIE is terminated when the epitaxial layer 4 is reached. Then ion implant boron at an energy of 40–100 KeV to form extrinsic base diffusion 17 in epitaxial layer 4. Attention is specifically directed to the fact that the foregoing RIE step results in the formation of the emitter-base (EB) spacer 16. The EB- spacer 16 is a small region of SiO$_2$ residing on the surface of the epitaxial layer and fully encompassing the space between the emitter 12 and the extrinsic base diffusion 17.

After the extrinsic base diffusion 17 ion implantation is accomplished, we are now ready for the formation of extrinsic base polysilicon extension 18, which is accomplished by vacuum evaporating a silicon layer 18 to a thickness of 200 to 300 nanometers on the exposed surface of the substrate. Then vacuum evaporate an SiO$_2$ layer 29 on the silicon layer 18 (see FIG. 19). The SiO$_2$ layer 29 has a thickness of approximately 100 nanometers. In addition, boron ions are implanted into the polysilicon layer 18 to reduce its electrical resistance.

Figure 20:
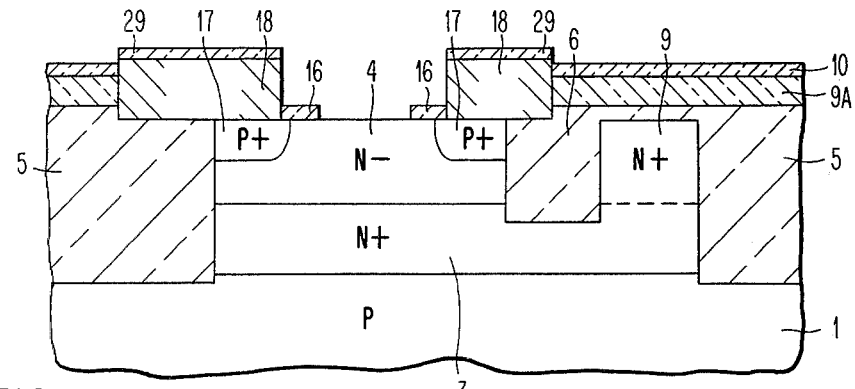

Then the resist layer 15 and the emitter plug 14 are removed to arrive at the structure shown in FIG. 20. Attention is directed to the remaining portion of the heavily boron doped polysilicon layer 18 i.e., the extrinsic base polysilicon extension, which is in intimate contact with the extrinsic base diffusion 17 forming the extrinsic base of the device as a whole.

Figure 21:
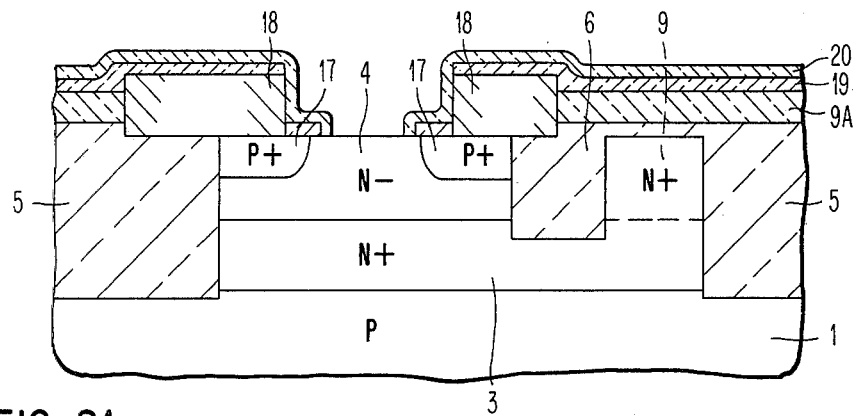

Thereafter, a layer 20 of CVD Si$_3$N$_4$ of 50 nanometers or more in thickness is blanket deposited. The structure is then subjected to an electrolytic treatment to convert the portion of the Si$_3$N$_4$ layer that covers the emitter region into SiO$_2$. The SiO$_2$ covering the emitter is then removed by dipping into a diluted BHF solution. Thereby, the EB-spacers 16 are protected by the Si$_3$N$_4$, as shown in FIG. 21. [Ref. "Conversion of Si$_3$N$_4$ Films to Anodic SiO$_2$" by P. F. Schmitt, and D. R. Wonsidler, J. Electrochm. Soc. 124, pp. 603, 605 (1967)].

Figure 22:
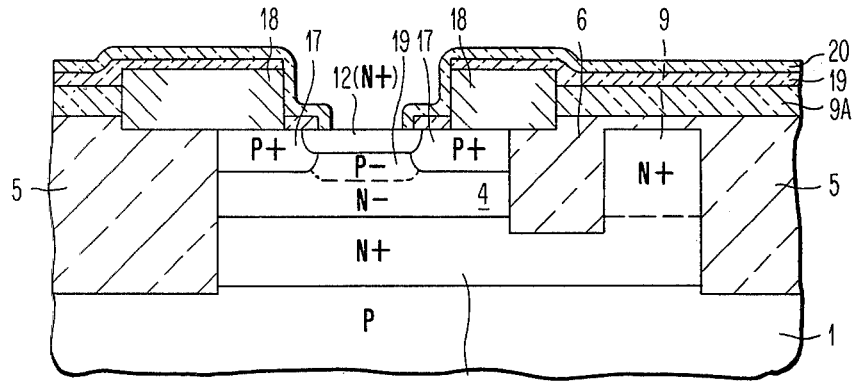

We are now ready to form the intrinsic base 19 and the emitter diffusion 12. As shown in FIG. 22, these are accomplished by double ion implantation of boron and arsenic at proper energy levels of e.g., 200 KeV and 40 KeV, respectively. Thereafter dopant drive-in is performed by heating the substrate to a temperature of ≧ 1000° C. The vertical dopant structure (profile) of the transistor is now completed. The transistor is depicted in FIG. 22 wherein the dopant profile is as follows:

$X_j$ emitter≈200 nanometers; $X_j$ extrinsic base≈400 nanometers; and $X_j$ intrinsic base≈200 nanometers (from emitter base junction).

Figure 23:
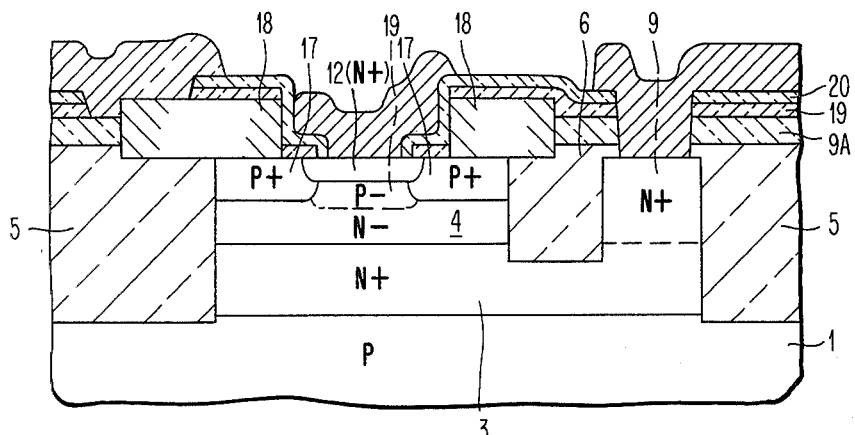

As depicted in FIG. 23, using photolithographic techniques, contact holes are opened to the extrinsic base polysilicon extension 18 and subcollector reach through 9.

The device is now ready for deposition of the metallurgy system which will interconnect the device shown with other devices including resistors and the like. The forming of the metallurgy system is well known in the art and it is deemed unnecessary that same be discussed or described.

While the invention has been particularly shown and described with reference to the preferred embodiments thereof, it will be understood by those skilled in the art that various changes in form and detail may be made therein without departing from the spirit and scope of the invention.

We claim:

1. In a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and at least first and second spaced apart recessed oxide isolation regions extending through said epitaxial layer into said substrate, said process including the following steps:

(a) forming a first oxide layer on said epitaxial layer;
(b) forming a silicon nitride layer on said first oxide layer;
(c) forming a second oxide layer on said silicon nitride layer;
(d) deposit a layer of photoresist on said second oxide layer;
(e) utilize E-beam photolithography to form a small emitter window in said photoresist layer, said emitter window being spaced between said first and second isolation regions;
(f) remove said second oxide layer exposed by said emitter window and also an adjacent surrounding portion of said second oxide layer beneath said photoresist;
(g) utilizing said emitter photoresist window reactive ion etch said silicon nitride layer and said first silicon oxide layer exposed through said window;
(h) ion implant an emitter region with dopant of a second conductivity type;
(i) remove said photoresist layer; and
(j) remove the portion of said silicon nitride layer exposed in step (f) and corresponding in area to said removed adjacent surrounding portion of said second layer.

2. In a process for forming an improved bipolar transistor as recited in claim 1, said process including subsequent to step (j) of claim 1 the following steps:
   (a) deposit an aluminum film on the exposed surface of said substrate; and
   (b) anodize the aluminum film on said emitter region to form $Al_2O_3$, where said anodization is defined by the opening in the silicon nitride layer formed in step (j) of claim 1;
   (c) densify and seal the $Al_2O_3$; and
   (d) strip off the unreacted Al.

3. In a process for forming an improved bipolar transistor, as recited in claim 1, said process including subsequent to step (j) of claim 1 the following steps:
   (a) deposit an aluminum film on the exposed surface of said substrate;
   (b) anodize the aluminum film covering said emitter region to form $Al_2O_3$, where said anodization is defined by the opening in the silicon nitride layer formed in step (j) of claim 1;
   (c) etch away the porous $Al_2O_3$ covering the emitter region to form an emitter well;
   (d) vacuum evaporate $Al_2O_3$ on the surface of the substrate to a thickness of approximately one-half the depth of the emitter well;
   (e) utilize a chemical etchant to remove the unreacted aluminum deposited in step (a) hereof; and
   (f) lift off the vacuum evaporated $Al_2O_3$ other than the $Al_2O_3$ deposited by vacuum evaporation in the emitter well.

4. In a process for forming an improved bipolar transistor, as recited in claim 1, said process including subsequent to step (j) of claim 1 the following steps:
   (a) deposit an aluminum film on the exposed surface of said substrate;
   (b) anodize the aluminum film covering said emitter region to form $Al_2O_3$ where said anodization is defined by the opening in the silicon nitride layer formed in step (j) of claim 1;
   (c) etch away the porous $Al_2O_3$ covering the emitter region to form an emitter well;
   (d) vacuum evaporate MgO on the surface of this substrate to a thickness of approximately one-half the depth of the emitter well;
   (e) utilize a chemical etchant to remove the unreacted aluminum deposited in step (a) hereof; and
   (f) lift off the vacuum evaporated MgO other than the MgO deposited by vacuum evaporation in the emitter well.

5. In a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including the following steps:
   (a) form a first oxide layer on said epitaxial layer;
   (b) form a silicon nitride layer on said first oxide layer;
   (c) form a second oxide layer on said silicon nitride layer;
   (d) deposit a layer of photoresist on said second oxide layer;
   (e) form a small emitter window in said layer of photoresist;
   (f) remove said second oxide layer exposed by said emitter window and also an adjacent surrounding portion of said second oxide layer beneath said photoresist;
   (g) utilizing said emitter photoresist window reactive ion etch (RIE) said silicon nitride layer and said first silicon oxide layer exposed through said window;
   (h) ion implant a dopant of a second conductivity type to form an emitter region;
   (i) remove said photoresist layer;
   (j) remove the portion of said silicon nitride layer exposed in step (f) and corresponding in area to said removed adjacent surrounding portion of said second layer;
   (k) deposit an aluminum film on the exposed surface of said substrate;
   (l) anodize the aluminum film covering said emitter region to form $Al_2O_3$ where said anodization is defined by the opening in the silicon nitride layer formed in step (j) supra;
   (m) densify and seal the $Al_2O_3$ to form an emitter plug;
   (n) strip off the unreacted Al leaving the emitter plug;
   (o) deposit a layer of photoresist;
   (p) form an extrinsic base window in said photoresist layer said extrinsic base window fully encompassing said emitter plug and extending from said first spaced apart recessed oxide isolation region to said second spaced apart recessed oxide isolation region;
   (q) utilizing said extrinsic base window reactive ion etch the exposed portion to said second oxide layer (10) said underlying portion of silicon nitride layer (9) and said underlying portion of first oxide layer to expose a portion of the epitaxial layer;
   (r) ion implant a dopant of a first conductivity type to form an extrinsic base region;
   (s) deposit a layer of polysilicon;
   (t) deposit a layer of silicon dioxide on said polysilicon layer;
   (u) ion implant said polysilicon layer with a dopant of said first conductivity type;
   (v) remove said resist layer and said emitter plug;
   (w) utilizing the remaining portion of said silicon dioxide layer, namely the junction spacer, ion implant a dopant of said first conductivity type to form the intrinsic base region;
   (x) deposit a layer of silicon nitride on the exposed surface;
   (y) convert the silicon nitride covering the emitter region to silicon dioxide; and
   (z) utilizing an etchant dip open the emitter contact opening.

6. In a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including the following step:
  (a) form a first oxide layer on the exposed surface;
  (b) form a silicon nitride layer on said first oxide layer;
  (c) form a second oxide layer on said silicon nitride layer;
  (d) deposit a layer of photoresist on said second oxide layer;
  (e) form a small emitter window in said layer of photoresist;
  (f) remove said second oxide layer exposed by said emitter window and also an adjacent surrounding portion of said second oxide layer beneath said photoresist;
  (g) utilizing said emitter photoresist window reactive ion etch (RIE) said silicon nitride layer and said first silicon oxide layer exposed through said window;
  (h) ion implant a dopant of a second conductivity type to form an emitter region;
  (i) remove said photoresist layer;
  (j) remove the portion of said silicon nitride layer exposed in step (f) and corresponding in area to said removed adjacent surrounding portion of said second layer;
  (k) deposit an aluminum film on the exposed surface of said substrate;
  (l) anodize the aluminum film covering said emitter region to form $Al_2O_3$ where said anodization is defined by the opening in the silicon nitride layer formed in step (j) supra;
  (m) remove the emitter $Al_2O_3$ to provide an emitter plug well;
  (n) vacuum evaporate $Al_2O_3$ to a thickness equal to approximately one-half the depth of the emitter well to form an emitter plug;
  (o) chemically etch and lift off aluminum film;
  (p) deposit a layer of photoresist;
  (q) form an extrinsic base window in said photoresist layer, said extrinsic base window fully encompassing said emitter plug and extending from said first spaced apart recessed oxide isolation region to said second spaced apart recessed oxide isolation region;
  (r) utilizing said extrinsic base window, reactive ion etch the exposed portion of second oxide layer said underlying portion of silicon nitride layer and said underlying portion of said first oxide layer to expose a portion of the epitaxial layer;
  (s) ion implant a dopant of a first conductivity type to form an extrinsic base region;
  (t) deposit a layer of polysilicon;
  (u) deposit a layer of silicon dioxide on said polysilicon layer;
  (v) ion implant said polysilicon layer with a dopant of said first conductivity type;
  (w) remove said resist layer and said emitter plug;
  (x) utilizing the remaining portion of said silicon dioxide layer, namely, the junction spacer ion implant a dopant of said first conductivity type to form the intrinsic base region;
  (y) deposit a layer of silicon nitride on the exposed surface;
  (z) convert the silicon nitride covering the emitter region to silicon dioxide; and
  (z+1) utilizing an etchant dip open the emitter contact opening.

7. In a process for forming an improved bipolar transistor in a silicon substrate of a first conductivity type, said silicon substrate having a planar surface, a subcollector region of a second conductivity type formed on said planar surface of said substrate, and first, second and third spaced apart recessed oxide isolation regions extending from the planar surface of said epitaxial layer into said substrate; a subcollector reach-through region positioned between said second and third recessed oxide isolation regions, said subcollector reach-through region extending from said planar surface of said epitaxial layer to said subcollector region, said process including the following steps;
  (a) form a first oxide layer on the exposed surface;
  (b) form a silicon nitride layer on said first oxide layer;
  (c) form a second oxide layer on said silicon nitride layer;
  (d) deposit a layer of photoresist on said second oxide layer;
  (e) form a small emitter window in said layer of photoresist;
  (f) remove said second oxide layer exposed by said emitter window and also an adjacent surrounding portion of said second oxide layer beneath said photoresist;
  (g) utilizing said emitter photoresist window reactive ion etch (RIE) said silicon nitride layer and said first silicon oxide layer exposed through said window;
  (h) ion implant a dopant of a second conductivity type to form an emitter region;
  (i) remove said photoresist layer;
  (j) remove the portion of said silicon nitride layer exposed in step (f) and corresponding in area to said removed adjacent surrounding portion of said second layer;
  (k) deposit an aluminum film on the exposed surface of said substrate;
  (l) anodize the aluminum film covering said emitter region to form $Al_2O_3$ where said anodization is defined by the opening in the silicon nitride layer formed in step (j) supra;
  (m) remove the emitter plug $Al_2O_3$, to provide an emitter plug well;
  (n) vacuum evaporate MgO to a thickness equal to approximately one-half the depth of the emitter well to form an emitter plug;
  (o) chemically etch and lift off aluminum film;
  (p) deposit a layer of photoresist;
  (q) form an extrinsic base window in said photoresist layer, said extrinsic base window fully encompassing said emitter plug and extending from said first spaced apart recessed oxide isolation region to said second spaced apart recessed oxide isolation region;
  (r) utilizing said extrinsic base window, reactive ion etch the exposed portion of said second oxide layer said under lying portion of silicon nitride layer and said underlying portion of said first oxide layer to expose a portion of the epitaxial layer;
  (s) ion implant a dopant of a first conductivity type to form an extrinsic base region;
  (t) deposit a layer of polysilicon;

(u) deposit a layer of silicon dioxide on said polysilicon layer;

(v) ion implant said polysilicon layer with a dopant of said first conductivity type;

(w) remove said resist layer 15 and said emitter plug;

(x) utilizing the remaining portion of said silicon dioxide layer, namely, the junction, spacer, ion implant a dopant of said first conductivity type to form the intrinsic base region;

(y) deposit a layer of silicon nitride on the exposed surface;

(z) convert the silicon nitride covering the emitter region to silicon dioxide; and (z+1) utilizing an etchant dip open the emitter contact opening.

Figure 8:
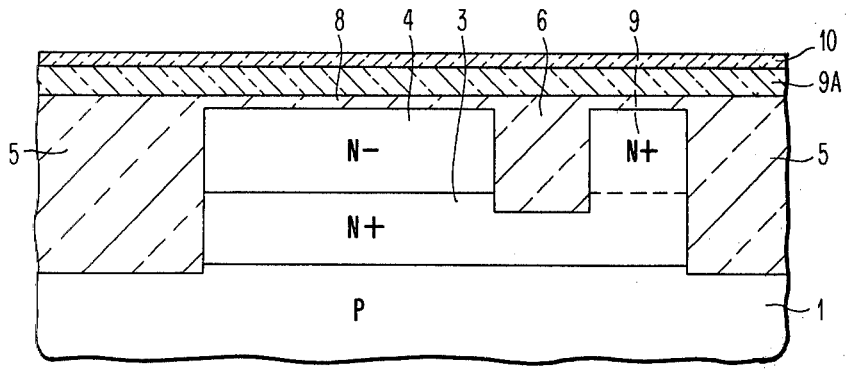

8. In a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including the following steps:

(a) form a first oxide layer (8, FIG. 8) on said epitaxial layer;

(b) form a silicon nitride layer (9A), FIG. 8) on said first oxide layer;

(c) form a second oxide layer (10, FIG. 8) on said silicon nitride layer;

(d) deposit a layer of photoresist (11, FIG. 9) on said second oxide layer;

(e) form a small emitter window (FIG. 9) in said layer of photoresist;

(f) remove said second oxide layer exposed by said emitter window and also an adjacent surrounding portion of said second oxide layer (FIG. 10) beneath said photoresist;

(g) utilizing said emitter photoresist window reactive ion etch (RIE) said silicon nitride layer (9A) and said first silicon oxide layer (8) exposed through said window (FIG. 11);

(h) remove said photoresist layer (11, FIG. 12);

(i) remove the portion of said silicon nitride layer (9A) exposed in step (f) and corresponding in area to said removed adjacent surrounding portion of said second layer (10, FIG. 13);

(j) deposit an aluminum film (13, FIG. 14) on the exposed surface of said substrate;

(k) anodize the aluminum film covering the to be formed emitter region to form $Al_2O_3$ (14, FIG. 14) where said anodization is defined by the opening in the silicon nitride layer (9A) formed in step (i) supra;

(l) densify and seal the $Al_2O_3$ to form an emitter plug (14, FIG. 14);

(m) strip off the unreacted Al leaving the emitter plug (14, FIG. 13);

(n) deposit a layer of photoresist (15, FIG. 17);

(o) form an extrinsic base window in said photoresist layer (15, FIG. 17) said extrinsic base window fully encompassing said emitter plug and extending from said first spaced apart recessed oxide isolation region to said second spaced apart recessed oxide isolation region;

(p) utilizing said extrinsic base window, reactive ion etch the exposed portion of said second oxide layer (10), said underlying portion of silicon nitride layer (9A) and said underlying portion of first oxide layer (8) to expose a portion of the epitaxial layer (4, FIG. 18);

(q) ion implant a dopant of a first conductivity type to form an extrinsic base region (17, FIG. 18);

(s) deposit a layer (18, FIG. 19) of polysilicon;

(t) ion implant said polysilicon layer (18, FIG. 19) with a dopant of said first conductivity type;

(u) remove said resist layer (15) and said emitter plug (14, FIG. 20);

(v) deposit a layer (20, FIG. 21) of silicon nitride on the exposed surface;

(w) convert the silicon nitride, covering the to be formed emitter region, (FIG. 21) to silicon dioxide; and (x) utilizing an etchant dip open the silicon dioxide covering the to be formed emitter region.

9. In a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including the following step:

(a) form a first oxide layer (8, FIG. 8) on the exposed surface;

(b) form a silicon nitride layer (9A, FIG. 8) on said first oxide layer;

(c) form a second oxide layer (10, FIG. 8) on said silicon nitride layer;

(d) deposit a layer of photoresist (11, FIG. 9) on said second oxide layer;

(e) form a small emitter window (FIG. 9) in said layer of photoresist;

(f) remove said second oxide layer exposed by said emitter window and also an adjacent surrounding portion of said photoresist;

(g) utilizing said emitter photoresist window, reactive ion etch (RIE) said silicon nitride layer (9A) and said first silicon oxide layer (8) exposed through said window (FIG. 11);

(h) remove said photoresist layer (11, FIG. 12);

(i) remove the portion of said silicon nitride layer (9A) exposed in step (f) and corresponding in area to said removed adjacent surrounding portion of said second layer (10, FIG. 12);

(j) deposit an aluminum film (13, FIG. 14) on the exposed surface of said substrate;

(k) anodize the aluminum film covering the to be formed emitter region to form an emitter plug of $Al_2O_3$ (14, FIG. 14), where said anodization is defined by the opening in the silicon nitride layer (9A) formed in step (i) supra;

(l) remove the emitter plug of $Al_2O_3$ (14, FIG. 15) to provide an emitter plug well (14', FIG. 15);

(m) vacuum evaporate Al$_2$O$_3$ to a thickness equal to approximately one-half the depth of the emitter well to form an emitter plug (14", FIG. 16);

(n) chemically etch and lift off the aluminum film (FIG. 16);

(o) deposit a layer of photoresist (15, FIG. 17);

(p) form an extrinsic base window in said photoresist layer (15, FIG. 17), said extrinsic base window fully encompassing said emitter plug and extending from said first spaced apart recessed oxide isolation region to said second spaced apart recessed oxide isolation region;

(q) utilizing said extrinsic base window, reactive ion etch the exposed portion of said second oxide layer (10) said underlying portion of silicon nitride layer (9A) and said underlying portion of said first oxide layer (8) to expose a portion of the epitaxial layer (4, FIG. 18);

(r) ion implant a dopant of a first conductivity type to form an extrinsic base region (17, FIG. 18);

(s) deposit a layer (18, FIG. 19) of polysilicon;

(t) deposit a layer (29, FIG. 19) of silicon dioxide on said polysilicon layer;

(u) ion implant said polysilicon layer (18, FIG. 19) with a dopant of said first conductivity type;

(v) remove said resist layer (15) and said emitter plug (14, FIG. 20);

(w) deposit a layer (20, FIG. 21) of silicon nitride on the exposed surface;

(x) convert the silicon nitride covering the to be formed emitter region (FIG. 22) to silicon dioxide; and (y) utilizing an etchant, remove the silicon dioxide covering the to be formed emitter region.

10. In a process for forming an improved bipolar transistor in a silicon substrate of a first conductivity type, said silicon substrate having a planar surface, a subcollector region of a second conductivity type formed on said planar surface of said substrate, and first, second and third spaced apart recessed oxide isolation regions extending from the planar surface of said epitaxial layer into said substrate; a subcollector reach-through region positioned between said second and third recessed oxide isolation regions, said subcollector reach-through region extending from said planar surface of said epitaxial layer to said subcollector region, said process including the following steps:

(a) form a first oxide layer (8, FIG. 8) on the exposed surface;

(b) form a silicon nitride layer (9A, FIG. 8) on said first oxide layer;

(c) form a second oxide layer (10, FIG. 8) on said silicon nitride layer;

(d) deposit a layer of photoresist (11, FIG. 9) on said second oxide layer;

(e) form a small emitter window (FIG. 9) in said layer of photoresist;

(f) remove said second oxide layer exposed by said emitter window and also an adjacent surrounding portion of said second oxide layer (FIG. 10) beneath said photoresist;

(g) utilizing said emitter photoresist window, reactive ion etch (RIE) said silicon nitride layer (9A) and said first silicon oxide layer (8) exposed through said window (FIG. 11);

(h) remove said photoresist layer (11, FIG. 12);

(i) remove the portion of said silicon nitride layer (9A) exposed in step (f) and corresponding in area to said removed adjacent surrounding portion of said second layer (10, FIG. 12);

(j) deposit an aluminum film (13, FIG. 14) on the exposed surface of said substrate;

(k) anodize the aluminum film covering the to be formed emitter region to form an emitter plug of Al$_2$O$_3$ (14, FIG. 14) where said anodization is defined by the opening in the silicon nitride layer (9A) formed in step (i) supra;

(l) remove the emitter plug of Al$_2$O$_3$, (14, FIG. 15) to provide an emitter plug well (14', FIG. 15);

(m) vacuum evaporate MgO to a thickness equal to approximately one-half the depth of the emitter well to form an emitter plug (14", FIG. 16);

(n) chemically etch and lift off the aluminum film (FIG. 16);

(o) deposit a layer of photoresist (15, FIG. 17);

(p) form an extrinsic base window in said photoresist layer (15, FIG. 17) said extrinsic base window fully encompassing said emitter plug and extending from said first spaced apart recessed oxide isolation region to said second spaced apart recessed oxide isolation region;

(q) utilizing said extrinsic base window, reactive ion etch the exposed portion of said second oxide layer (10) said underlying portion of silicon nitride layer (9A) and said underlying portion of said first oxide layer (8) to expose a portion of the epitaxial layer (4, FIG. 18);

(r) ion implant a dopant of a first conductivity type to form an extrinsic base region (17, FIG. 18);

(s) deposit a layer (18, FIG. 19) of polysilicon;

(t) deposit a layer (29, FIG. 19) of silicon dioxide on said polysilicon layer;

(u) ion implant said polysilicon layer (18, FIG. 19) with a dopant of said first conductivity type;

(v) remove said resist layer 15 and said emitter plug (14, FIG. 20);

(w) deposit a layer (20, FIG. 21) of silicon nitride on the exposed surface;

(x) convert the silicon nitride covering the to be formed emitter region (FIG. 22) to silicon dioxide; and (y) utilizing an etchant, remove the silicon dioxide covering the to be formed emitter region.

11. In a process for forming an improved bipolar transistor, as recited in claim 8, 9 or 10, in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including, following the last step of claim 8, 9 or 10, the following steps:

(1) form an emitter region, said second conductivity type; and (2) form an intrinsic base region of said first conductivity type beneath said emitter region.

* * * * *